US012776747B2

(12) United States Patent
Yang et al.

(10) Patent No.: US 12,776,747 B2
(45) Date of Patent: Oct. 27, 2026

(54) RELAXATION OSCILLATOR

(71) Applicant: REALTEK SEMICONDUCTOR CORPORATION, Hsinchu (TW)

(72) Inventors: Wen-Hau Yang, Hsinchu (TW); Chun-Yu Luo, Hsinchu (TW); Hung-Hsuan Cheng, Hsinchu (TW); Tzu-Huan Chiu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 19/240,303

(22) Filed: Jun. 17, 2025

(65) Prior Publication Data

US 2026/0058604 A1 Feb. 26, 2026

(30) Foreign Application Priority Data

Aug. 20, 2024 (TW) ................................ 113131355

(51) Int. Cl.
*H03K 3/0231* (2006.01)
*H03B 5/24* (2006.01)
*H03K 3/037* (2006.01)

(52) U.S. Cl.
CPC ............ *H03B 5/24* (2013.01); *H03K 3/0231* (2013.01); *H03K 3/037* (2013.01)

(58) Field of Classification Search
CPC ................................ H03B 5/24; H03K 3/0231
USPC .......................................... 331/111, 143–153
See application file for complete search history.

(56) References Cited

U.S. PATENT DOCUMENTS

| | | | | |
|---|---|---|---|---|
| 6,356,161 B1 * | 3/2002 | Nolan | H03K 3/011 | 331/74 |
| 8,232,846 B1 * | 7/2012 | De Vita | H03K 4/502 | 331/111 |
| 2015/0205319 A1 * | 7/2015 | De Cremoux | G05F 3/262 | 331/109 |
| 2016/0013753 A1 * | 1/2016 | Tam | H03B 5/04 | 331/111 |

* cited by examiner

*Primary Examiner* — Levi Gannon
(74) *Attorney, Agent, or Firm* — WPAT, PC

(57) ABSTRACT

A relaxation oscillator includes first to the sixth transistor, a resistor, a capacitor, an inverter, a pulse generator, and first to the third switch. The resistor is coupled between the third source and the third gate of the third transistor. The capacitor is coupled between the fourth source and the fourth gate of the fourth transistor. The input terminal of the inverter is coupled to the sixth drain of the sixth transistor. The pulse generator generates a pulse signal. The first switch is coupled between the inverter and a first reference voltage. The second switch is coupled between the inverter and the fifth transistor. The third switch is coupled between the fourth transistor and a second reference voltage. The first to third switches are turned on or off according to the pulse signal.

10 Claims, 5 Drawing Sheets

RELAXATION OSCILLATOR

BACKGROUND OF THE INVENTION

1. Field of the Invention

The present invention generally relates to an electronic oscillator, and more particularly, to a relaxation oscillator.

2. Description of Related Art

Electronic oscillators are widely used in electronic circuits to provide periodic signals. The electronic oscillator mainly includes the harmonic oscillator and the relaxation oscillator. Providing a relaxation oscillator that can generate an accurate periodic signal is an important topic in this field.

SUMMARY OF THE INVENTION

In view of the issues of the prior art, an object of the present invention is to provide a relaxation oscillator, so as to make an improvement to the prior art.

According to one aspect of the present invention, a relaxation oscillator is provided. The relaxation oscillator includes a first transistor, a second transistor, a third transistor, a resistor, a fourth transistor, a capacitor, a fifth transistor, a sixth transistor, an inverter, a pulse generator, a first switch, a second switch, and a third switch. The first transistor has a first source, a first gate, and a first drain, wherein the first source is coupled to a first reference voltage, and the first gate is coupled to the first drain. The second transistor has a second source, a second gate, and a second drain, wherein the second source is coupled to the first reference voltage, and the second gate is coupled to the first gate. The third transistor has a third source, a third gate, and a third drain, wherein the third drain is coupled to the first drain, and the third gate is coupled to a second reference voltage. The resistor is coupled between the third source and the third gate. The fourth transistor has a fourth source, a fourth gate, and a fourth drain, wherein the fourth drain is coupled to the second drain, and the fourth gate is coupled to the second reference voltage. The capacitor is coupled between the fourth source and the fourth gate. The fifth transistor has a fifth source, a fifth gate, and a fifth drain, wherein the fifth source is coupled to the second reference voltage, and the fifth gate is coupled to the fourth drain. The sixth transistor has a sixth source, a sixth gate, and a sixth drain, wherein the sixth source is coupled to the first reference voltage, the sixth gate is coupled to the first gate, and the sixth drain is coupled to the fifth drain. The inverter has an input terminal and an output terminal, wherein the input terminal is coupled to the sixth drain. The pulse generator is coupled to the output terminal of the inverter and is configured to generate a pulse signal. The first switch is coupled between the inverter and the first reference voltage, and is turned on or off according to the pulse signal. The second switch is coupled between the inverter and the fifth transistor, and is turned on or off according to the pulse signal. The third switch is coupled between the fourth transistor and the second reference voltage, and is turned on or off according to the pulse signal.

According to another aspect of the present invention, a relaxation oscillator is provided. The relaxation oscillator includes a bandgap voltage reference circuit, an operational amplifier, a first transistor, a second transistor, a resistor, a third transistor, a capacitor, a comparator, an inverter, a pulse generator, and a switch. The bandgap voltage reference circuit is used to generate a first reference voltage. The operational amplifier has a first input terminal, a second input terminal, and a first output terminal, wherein the first input terminal receives the first reference voltage. The first transistor has a first source, a first gate, and a first drain, wherein the first source is coupled to the second input terminal, and the first gate is coupled to the first output terminal. The second transistor has a second source, a second gate, and a second drain, wherein the second source is coupled to a second reference voltage, the second gate is coupled to the second drain, and the second drain is coupled to the first drain of the first transistor. The resistor is coupled between the first source of the first transistor and a third reference voltage. The third transistor has a third source, a third gate, and a third drain, wherein the third source is coupled to the second reference voltage, and the third gate is coupled to the second gate of the second transistor. The capacitor is coupled between the third drain of the third transistor and the third reference voltage. The comparator has a third input terminal, a fourth input terminal, and a second output terminal, wherein the third input terminal receives the first reference voltage, and the fourth input terminal is coupled to the third drain of the third transistor. The inverter has a fifth input terminal and a third output terminal, wherein the fifth input terminal is coupled to the second output terminal of the comparator. The pulse generator is coupled to the third output terminal of the inverter and is used to generate a pulse signal. The switch is coupled between the third drain of the third transistor and the third reference voltage, and is turned on or off according to the pulse signal.

The technical means embodied in the embodiments of the present invention can solve at least one of the problems of the prior art. Therefore, compared to the prior art, the present invention can generate more accurate periodic signals.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes relaxation oscillators. On account of that some or all elements of the relaxation oscillators could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 1:
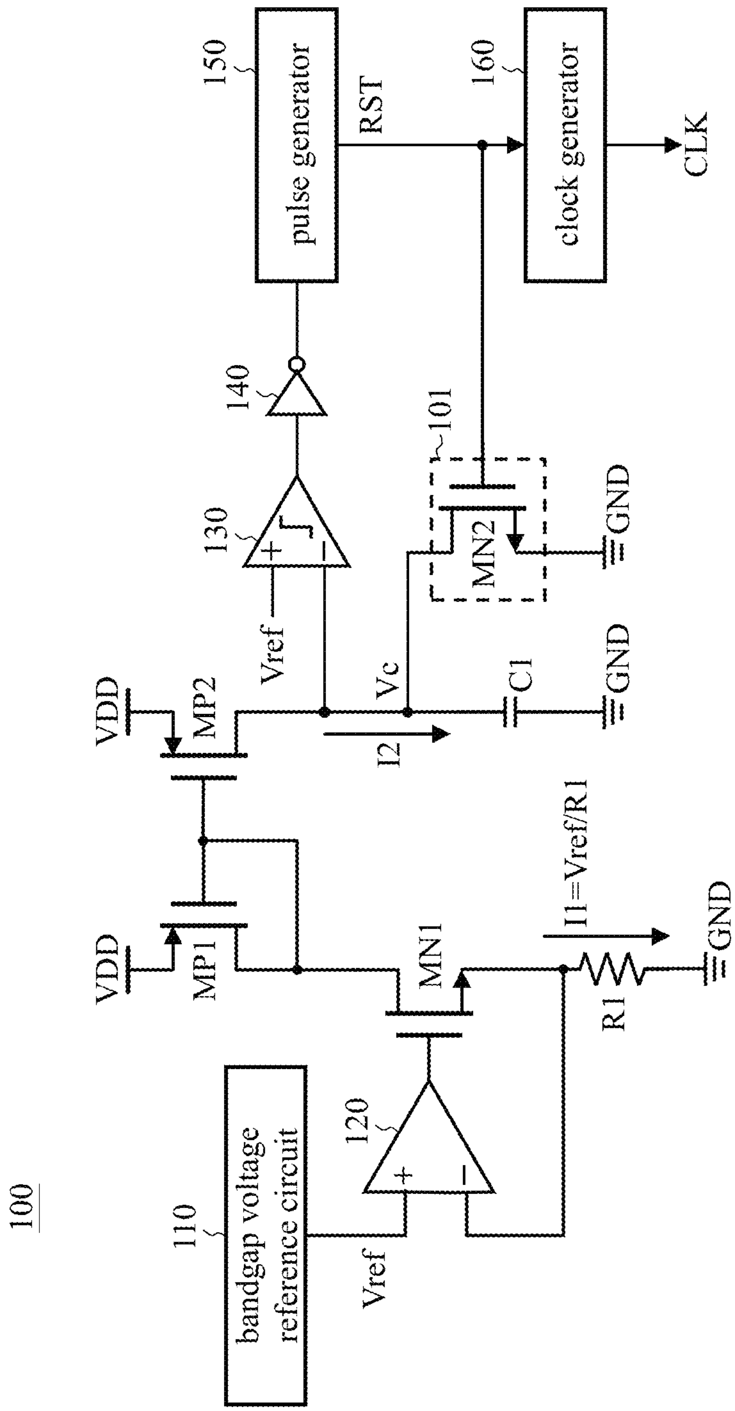
FIG. 1 is the circuit diagram of a relaxation oscillator according to an embodiment of the present invention.

Reference is made to FIG. 1, which is the circuit diagram of a relaxation oscillator according to an embodiment of the present invention. The relaxation oscillator 100 includes a bandgap voltage reference circuit 110, an operational amplifier 120, a comparator 130, an inverter 140, a pulse generator 150, a clock generator 160, a P-channel Metal-Oxide-Semiconductor Field-Effect Transistor (hereinafter referred to as the PMOS transistor) MP1, the PMOS transistor MP2, an N-channel Metal-Oxide-Semiconductor Field-Effect Transistor (hereinafter referred to as the NMOS transistor) MN1, a switch 101, a resistor R1, and a capacitor C1.

The switch 101 is embodied by the NMOS transistor MN2. The drain and the source of the MOS transistor are the two terminals of a switch, and the gate of the MOS transistor is the control terminal of the switch.

The source of the PMOS transistor MP1 is coupled or electrically connected to the reference voltage VDD (e.g., the power supply voltage). The gate of the PMOS transistor MP1 is coupled or electrically connected to the drain of the PMOS transistor MP1.

The drain of the NMOS transistor MN1 is coupled or electrically connected to the gate and drain of the PMOS transistor MP1.

One terminal of the resistor R1 is coupled or electrically connected to the source of the NMOS transistor MN1. The other terminal of the resistor R1 is coupled or electrically connected to the reference voltage GND (e.g., ground).

The non-inverting input terminal of the operational amplifier 120 is coupled or electrically connected to the bandgap voltage reference circuit 110 to receive the reference voltage Vref generated by the bandgap voltage reference circuit 110. The inverting input terminal of the operational amplifier 120 is coupled or electrically connected to the source of the NMOS transistor MN1. The output terminal of the operational amplifier 120 is coupled or electrically connected to the gate of the NMOS transistor MN1.

The source of the PMOS transistor MP2 source is coupled or electrically connected to the reference voltage VDD. The gate of the PMOS transistor MP2 is coupled or electrically connected to the gate and drain of the PMOS transistor MP1.

One terminal of the capacitor C1 is coupled or electrically connected to the drain of the PMOS transistor MP2. The other terminal of the capacitor C1 is coupled or electrically connected to the reference voltage GND.

The non-inverting input terminal of the comparator 130 receives the reference voltage Vref. The inverting input terminal of the comparator 130 is coupled or electrically connected to the drain of the PMOS transistor MP2. The comparator 130 compares the voltage Vc with the reference voltage Vref.

The input terminal of the inverter 140 is coupled or electrically connected to the output terminal of the comparator 130.

The pulse generator 150 is coupled or electrically connected to the output terminal of the inverter 140 and is configured to generate the pulse signal RST based on the output signal of the inverter 140 (which is equivalent to being based on the output signal of the comparator 130, and equivalent to being based on the voltage Vc). The implementation of the pulse generator 150 using logic circuits is well known to people having ordinary skill in the art, so further elaboration is omitted for brevity.

The switch 101 resets the voltage Vc to the reference voltage GND based on the pulse signal RST. More specifically, when the pulse signal RST is at a high level, the voltage Vc is substantially equal to the reference voltage GND. In some embodiments, the switch 101 is embodied by an NMOS transistor MN2. The drain of the NMOS transistor MN2 is coupled or electrically connected to the drain of the PMOS transistor MP2. The gate of the NMOS transistor MN2 is coupled or electrically connected to the pulse generator 150 to receive the pulse signal RST. The source of the NMOS transistor MN2 is coupled or electrically connected to the reference voltage GND.

The clock generator 160 is coupled or electrically connected to the pulse generator 150 to generate the clock CLK based on the pulse signal RST.

Figure 2:
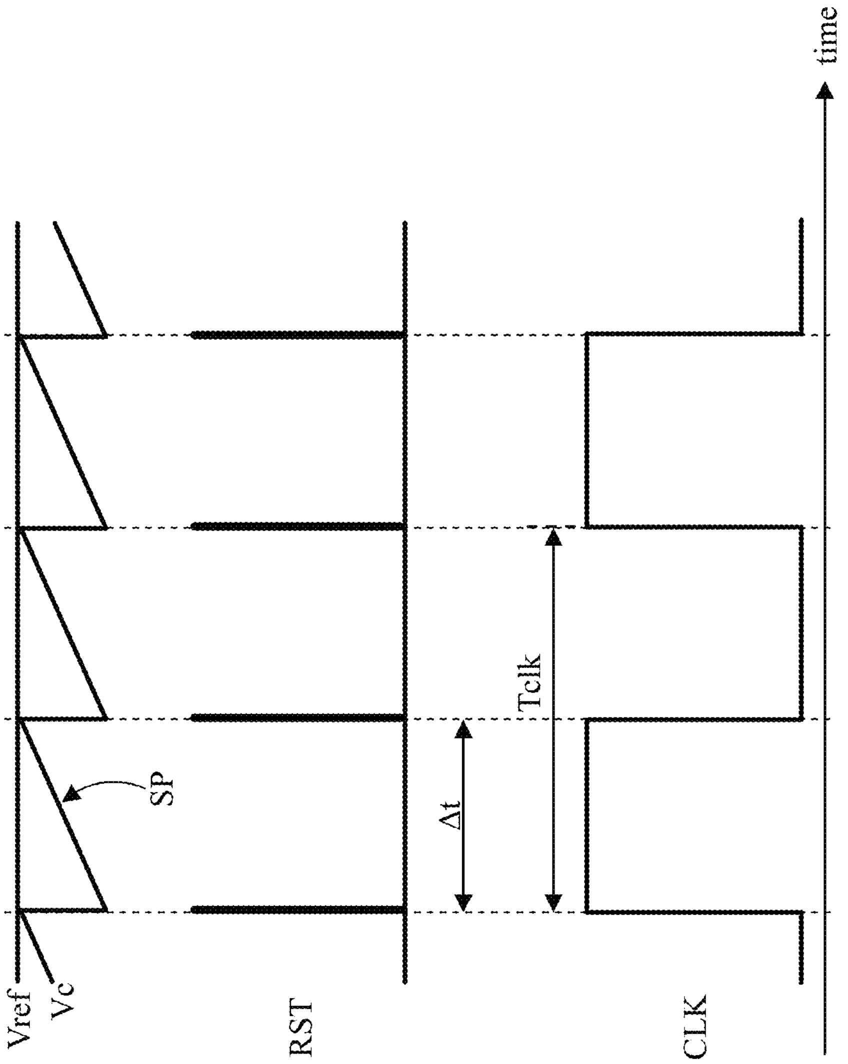
FIG. 2 shows the waveforms of several signals from FIG. 1.

Reference is made to FIG. 2, which shows the waveforms of several signals from FIG. 1. Every time the voltage Vc (the voltage across the capacitor C1) equals the reference voltage Vref, the output signal of the comparator 130 transitions, and the pulse generator 150 accordingly generates the pulse signal RST. The slope SP of the voltage Vc is I2/C1. The current I2 is the current flowing through the capacitor C1, and I2=I1=Vref/R1. The switch 101 resets the voltage Vc to the reference voltage GND based on the pulse signal RST. The clock generator 160 generates a clock CLK with a duty ratio of 50% based on the pulse signal RST. The clock generator 160 may be a frequency divider circuit. For the capacitor C1, the relationship between the current I2 and the voltage Vc is shown in equation (1).

$$I2 = I1 = C1 * Vc/\Delta t \tag{1}$$

As shown in FIG. 2, because Δt=Tclk/2 and Vc=Vref, the period Tclk can be obtained as shown in Equation (2).

$$Tclk = 2 * R1 * C1 \tag{2}$$

As shown in FIG. 2, the relaxation oscillator 100 can generate the pulse signal RST and the clock CLK with a fairly accurate period. The periods of the pulse signal RST and the clock CLK can be adjusted by changing the slope SP.

Figure 3:
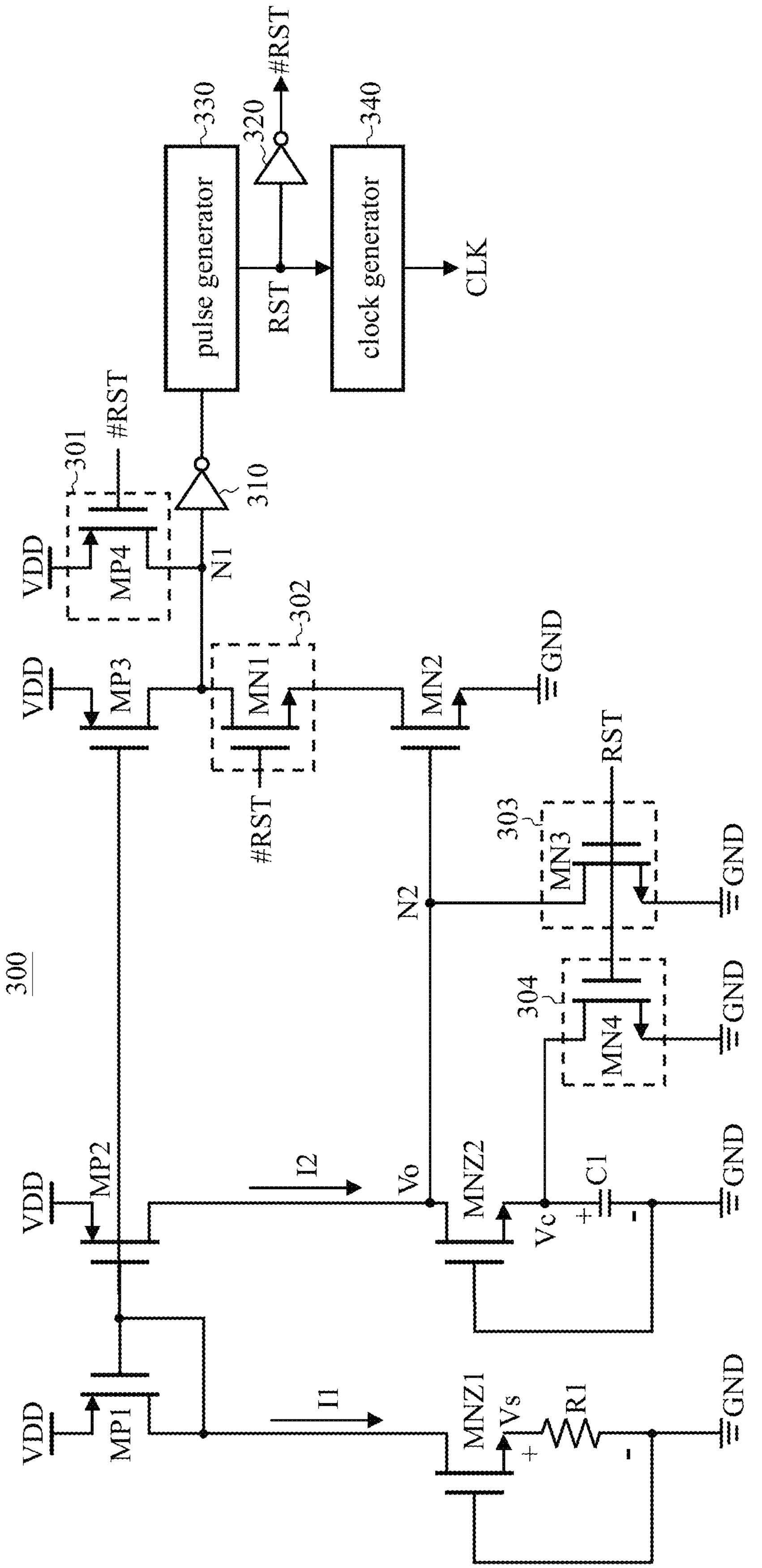
FIG. 3 is the circuit diagram of a relaxation oscillator according to another embodiment of the present invention.

Reference is made to FIG. 3, which is the circuit diagram of a relaxation oscillator according to another embodiment of the present invention. The relaxation oscillator 300 includes the NMOS transistors MNZ1, MNZ2, MN1, MN2, MN3, MN4, the PMOS transistors MP1, MP2, MP3, MP4, the resistor R1, the capacitor C1, the inverter 310, the inverter 320, the pulse generator 330, and the clock generator 340.

The PMOS transistor MP4, the NMOS transistor MN1, the NMOS transistor MN3, and the NMOS transistor MN4 serve as the switch 301, the switch 302, the switch 303, and the switch 304, respectively. The switch 301 resets the voltage at the node N1 to the reference voltage VDD based on the inverted signal #RST of the pulse signal RST (which is equivalent to being based on the pulse signal RST). The switch 302 couples or electrically connects the node N1 to the drain of the NMOS transistor MN2 according to the inverted signal #RST. The switch 303 resets the voltage at the node N2 (i.e., the voltage Vo) to the reference voltage GND based on the pulse signal RST (which is equivalent to being based on the inverted signal #RST). The switch 304 resets the voltage Vc to the reference voltage GND based on the pulse signal RST.

The NMOS transistor MNZ1 and the NMOS transistor MNZ2 are NMOS transistors with a negative threshold voltage, while the other transistors are regular transistors. The absolute value of the threshold voltage of the NMOS transistor MNZ1 is |VGSZ1|, while the absolute value of the threshold voltage of the NMOS transistor MNZ2 is |VGSZ2|.

The source of the PMOS transistor MP1 is coupled or electrically connected to the reference voltage VDD. The gate of the PMOS transistor MP1 is coupled or electrically connected to the drain of the PMOS transistor MP1.

The drain of the NMOS transistor MNZ1 is coupled or electrically connected to the drain of the PMOS transistor MP1. The source of the NMOS transistor MNZ1 is coupled or electrically connected to one terminal of the resistor R1. The gate of the NMOS transistor MNZ1 is coupled or electrically connected to the other terminal of the resistor R1. The gate of the NMOS transistor MNZ1 and the other terminal of the resistor R1 are coupled or electrically connected to the reference voltage GND.

The source of the PMOS transistor MP2 source is coupled or electrically connected to the reference voltage VDD. The gate of the PMOS transistor MP2 is coupled or electrically connected to the gate and drain of the PMOS transistor MP1.

The drain of the NMOS transistor MNZ2 is coupled or electrically connected to the drain of the PMOS transistor MP2. The source of the NMOS transistor MNZ2 is coupled or electrically connected to one terminal of the capacitor C1. The gate of the NMOS transistor MNZ2 is coupled or electrically connected to the other terminal of the capacitor C1. The gate of the NMOS transistor MNZ2 and the other terminal of the capacitor C1 are coupled or electrically connected to the reference voltage GND.

The source of the PMOS transistor MP3 is coupled or electrically connected to the reference voltage VDD. The gate of the PMOS transistor MP3 is coupled or electrically connected to the gate of the PMOS transistor MP1. The drain of the PMOS transistor MP3 is coupled or electrically connected to the node N1, and is coupled to the NMOS transistor MN2 through the switch 302. The PMOS transistor MP3 is used to provide a bias current.

The source of the PMOS transistor MP4 is coupled or electrically connected to the reference voltage VDD. The gate of the PMOS transistor MP4 receives the inverted signal #RST of the pulse signal RST. The drain of the PMOS transistor MP4 is coupled or electrically connected to the node N1. When the inverted signal #RST is at a low level, the switch 301 is turned on, thus the voltage at the node N1 is reset to the reference voltage VDD.

The drain of the NMOS transistor MN1 is coupled or electrically connected to the node N1. The gate of the NMOS transistor MN1 receives the inverted signal #RST. When the inverted signal #RST is at a high level, the switch 302 is turned on, thus the node N1 and the drain of the NMOS transistor MN2 are at substantially the same potential.

The drain of the NMOS transistor MN2 is coupled or electrically connected to the source of the NMOS transistor MN1, and is coupled to the node N1 through the switch 302. The gate of the NMOS transistor MN2 is coupled or electrically connected to the node N2 (i.e., the drain of the PMOS transistor MP2 and the drain of the NMOS transistor MNZ2). The source of the NMOS transistor MN2 is coupled or electrically connected to the reference voltage GND. The NMOS transistor MN2 serves as a common-source amplifier to amplify the voltage Vo.

The drain of the NMOS transistor MN3 is coupled or electrically connected to the node N2. The gate of the NMOS transistor MN3 receives the pulse signal RST. The source of the NMOS transistor MN3 is coupled or electrically connected to the reference voltage GND. When the pulse signal RST is at a high level, the switch 303 is turned on, thus the voltage at the node N2 (i.e., the voltage Vo) is reset to the reference voltage GND.

The drain of the NMOS transistor MN4 is coupled or electrically connected to the source of the NMOS transistor MNZ2. The gate of the NMOS transistor MN4 receives the pulse signal RST. The source of the NMOS transistor MN4 is coupled or electrically connected to the reference voltage GND. When the pulse signal RST is at a high level, the switch 304 is turned on, thus the voltage Vc is reset to the reference voltage GND.

In some embodiments, the switch 303 can be omitted. When the switch 304 resets the voltage Vc to the reference voltage GND, the NMOS transistor MNZ2 is turned on, causing the voltage Vo to be substantially equal to the reference voltage GND.

The input terminal of the inverter 310 is coupled or electrically connected to the node N1. The output terminal of the inverter 310 is coupled or electrically connected to the pulse generator 330.

The pulse generator 330 generates the pulse signal RST based on the output signal of the inverter 310 (which is equivalent to being based on the voltage Vo). The implementation of the pulse generator 330 is well known to people having ordinary skill in the art, so further elaboration is omitted for brevity.

The input terminal of the inverter 320 is coupled or electrically connected to the pulse generator 330. The inverter 320 receives the pulse signal RST and outputs the inverted signal #RST.

The clock generator 340 is coupled or electrically connected to the pulse generator 330 and generates the clock CLK based on the pulse signal RST.

The current I1 flows through the resistor R1, and the magnitude of the current I1 is Vs/R1=|VGSZ1|/R1. Because the PMOS transistor MP1 and the PMOS transistor MP2 form a current mirror, the current I2 is substantially equal to the current I1.

Figure 4:
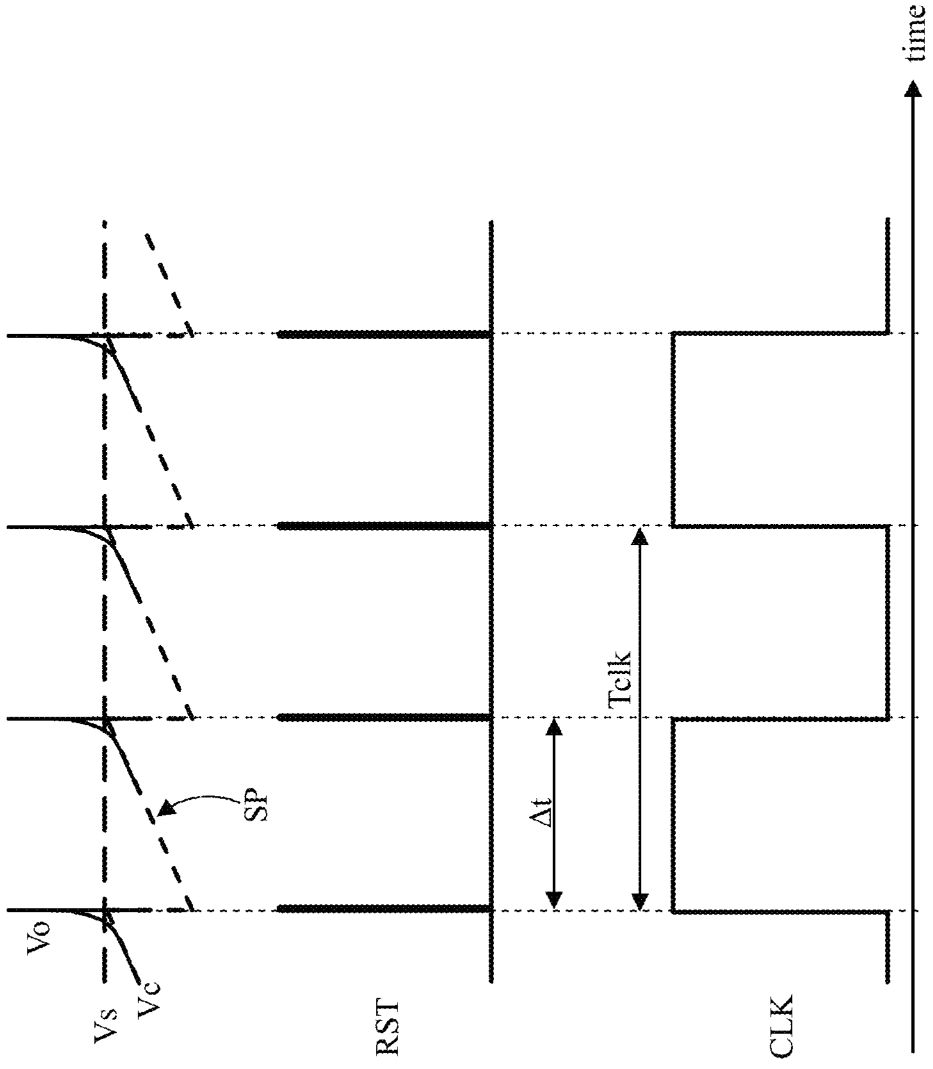
FIG. 4 shows the waveforms of several signals from FIG. 3.

Reference is made to FIG. 4, which shows the waveforms of several signals from FIG. 3. When the NMOS transistor MNZ2 is turned on (i.e., when Vc>|VGSZ2|), the current I2 charges the capacitor C1, causing the voltage Vc and the voltage Vo to gradually increase (the slope SP is I2/C1). After the voltage Vc and the voltage Vo increase to be above the threshold voltage |VGSZ2| of the NMOS transistor MNZ2, the NMOS transistor MNZ2 gradually cuts off, causing the voltage Vo to rise instantaneously. This triggers the NMOS transistor MN2 to turn on, thereby pulling down the potential at the node N1. Following this, the pulse generator 330 generates a pulse (i.e., the pulse signal RST is momentarily pulled high) according to the output of the inverter 310 (high level), causing the NMOS transistor MN3 and the NMOS transistor MN4 to turn on, thereby resetting the voltage Vo and the voltage Vc to the reference voltage GND. The relaxation oscillator 300 automatically repeats the above process, and a periodic pulse signal RST is obtained. The clock generator 340 generates a clock CLK with a 50% duty ratio based on the pulse signal RST.

Figure 5:
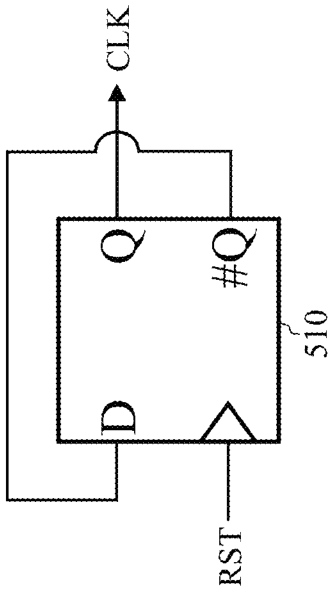
FIG. 5 is the circuit diagram of the clock generator according to an embodiment of the present invention.

The clock generator 160 and the clock generator 340 can be embodied by a frequency divider. In some embodiments, the D flip-flop 510 of FIG. 5 can be used to implement the frequency divider. The clock pin of the D flip-flop 510 receives the pulse signal RST, the data pin D is connected to the inverted output terminal #Q, and the output terminal Q outputs the clock CLK.

The current I1 and the current I2 are shown in equation (3) and equation (4), respectively.

$$I1 = |VGSZ1|/R1 \quad (3)$$

$$I2 = I1 = C1 * Vc/\Delta t \quad (4)$$

wherein Δt=Tclk/2, while Vc=|VGSZ2|. When |VGSZ1|=|VGSZ2| (i.e., when the aspect ratios of the NMOS transistor MNZ1 and the NMOS transistor MNZ2 are substantially the same), according to equation (3) and equation (4), Tclk=2*R1*C1 (the same as equation (2)). In other words, the clock CLK generated by the relaxation oscillator 300 is the same as the clock CLK generated by the relaxation oscillator 100.

It should be noted that, in an alternative embodiment, the NMOS transistor MNZ1 and the NMOS transistor MNZ2 may have different aspect ratios. People having ordinary skill in the art can change the relationship between the voltage Vs and the voltage Vc in FIG. 4 by adjusting the aspect ratios of the NMOS transistors MNZ1 and MNZ2, thereby adjusting the periods of the pulse signal RST and the clock CLK.

Compared to the relaxation oscillator 100, because the relaxation oscillator 300 does not require the bandgap voltage reference circuit 110, the operational amplifier 120, and the comparator 130, the circuit area of the relaxation oscillator 300 is relatively small, the power consumption is relatively low, and the start-up time is relatively short.

In other embodiments, the PMOS transistors and the NMOS transistors in the aforementioned embodiment may be replaced by NMOS transistors and PMOS transistors, respectively. People having ordinary skill in the art know how to adjust the clock and the reference voltages accordingly to implement the embodiments discussed above.

Note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A relaxation oscillator, comprising:

a first transistor having a first source, a first gate, and a first drain, wherein the first source is coupled to a first reference voltage, and the first gate is coupled to the first drain;

a second transistor having a second source, a second gate, and a second drain, wherein the second source is coupled to the first reference voltage, and the second gate is coupled to the first gate;

a third transistor having a third source, a third gate, and a third drain, wherein the third drain is coupled to the first drain, and the third gate is coupled to a second reference voltage;

a resistor coupled between the third source and the third gate;

a fourth transistor having a fourth source, a fourth gate, and a fourth drain, wherein the fourth drain is coupled to the second drain, and the fourth gate is coupled to the second reference voltage;

a capacitor coupled between the fourth source and the fourth gate;

a fifth transistor having a fifth source, a fifth gate, and a fifth drain, wherein the fifth source is coupled to the second reference voltage, and the fifth gate is coupled to the fourth drain;

a sixth transistor having a sixth source, a sixth gate, and a sixth drain, wherein the sixth source is coupled to the first reference voltage, the sixth gate is coupled to the first gate, and the sixth drain is coupled to the fifth drain;

an inverter having an input terminal and an output terminal, wherein the input terminal is coupled to the sixth drain;

a pulse generator coupled to the output terminal of the inverter and configured to generate a pulse signal;

a first switch coupled between the inverter and the first reference voltage, and turned on or off according to the pulse signal;

a second switch coupled between the inverter and the fifth transistor, and turned on or off according to the pulse signal; and a third switch coupled between the fourth transistor and the second reference voltage, and turned on or off according to the pulse signal.

2. The relaxation oscillator of claim 1, wherein the third transistor and the fourth transistor are metal-oxide-semiconductor field-effect transistors with a negative threshold voltage.

3. The relaxation oscillator of claim 2, wherein a first aspect ratio of the third transistor is substantially equal to a second aspect ratio of the fourth transistor.

4. The relaxation oscillator of claim 1, wherein the first switch is a seventh transistor, the seventh transistor has a seventh source, a seventh gate, and a seventh drain, the seventh source is coupled to the first reference voltage, the seventh gate receives an inverted signal of the pulse signal, and the seventh drain is coupled to the input terminal of the inverter.

5. The relaxation oscillator of claim 1, wherein the second switch is a seventh transistor, the seventh transistor has a seventh source, a seventh gate, and a seventh drain, the seventh drain is coupled to the input terminal of the inverter, the seventh source is coupled to the fifth drain of the fifth transistor, and the seventh gate receives an inverted signal of the pulse signal.

6. The relaxation oscillator of claim 1, wherein the third switch is a seventh transistor, the seventh transistor has a seventh source, a seventh gate, and a seventh drain, the seventh source is coupled to the second reference voltage, the seventh gate receives the pulse signal, and the seventh drain is coupled to the fourth source of the fourth transistor.

7. The relaxation oscillator of claim 1 further comprising:

a fourth switch coupled between the fourth transistor and the second reference voltage, and turned on or off according to the pulse signal.

8. The relaxation oscillator of claim 7, wherein the fourth switch is a seventh transistor, the seventh transistor has a seventh source, a seventh gate, and a seventh drain, the seventh source is coupled to the second reference voltage, the seventh gate receives the pulse signal, and the seventh drain is coupled to the fourth drain of the fourth transistor.

9. The relaxation oscillator of claim 1 further comprising:

a clock generator coupled to the pulse generator and configured to generate a clock based on the pulse signal.

10. The relaxation oscillator of claim 9, wherein the output terminal of the inverter is a first output terminal, the clock generator is a D flip-flop, a clock pin of the D flip-flop receives the pulse signal, a second output terminal of the D flip-flop outputs the clock, and a data pin of the D flip-flop is coupled to an inverted output terminal of the D flip-flop.

* * * * *